(12) United States Patent
Huang (10) Patent No.: US 12,444,722 B2
(45) Date of Patent: Oct. 14, 2025

(54) DISPLAY PANEL COMPRISING A SUBSTRATE INCLUDING A FIRST REGION AND A SECOND REGION AND DISPLAY APPARATUS HAVING THE SAME

(71) Applicant: SeeYa Optronics Co., Ltd., Shanghai (CN)

(72) Inventor: Zhongshou Huang, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 443 days.

(21) Appl. No.: 17/943,989

(22) Filed: Sep. 13, 2022

(65) Prior Publication Data
US 2023/0093906 A1  Mar. 30, 2023

(30) Foreign Application Priority Data

Sep. 30, 2021  (CN) ........................ 202111165265.3

(51) Int. Cl.
| | | |
|---|---|---|
| H01L 29/08 | (2006.01) | |
| H01L 25/16 | (2023.01) | |
| H10D 86/40 | (2025.01) | |
| H10D 86/60 | (2025.01) | |
| H10K 59/121 | (2023.01) | |

(52) U.S. Cl.
CPC ......... H01L 25/167 (2013.01); H10D 86/471 (2025.01); H10D 86/60 (2025.01); H10K 59/1213 (2023.02)

(58) Field of Classification Search
CPC .............. H10K 59/1213; H01L 25/167; H10D 86/471; H10D 86/60

USPC .......................................................... 257/40
See application file for complete search history.

(56) References Cited

U.S. PATENT DOCUMENTS

| | | | |
|---|---|---|---|
| 9,698,176 B1* | 7/2017 | Kumar | H10D 86/0221 |
| 11,723,238 B2* | 8/2023 | Kim | H10K 77/111 |
| | | | 257/40 |
| 2011/0109351 A1 | 5/2011 | Yamazaki et al. | |
| 2015/0054799 A1 | 2/2015 | Chang et al. | |
| 2020/0287049 A1* | 9/2020 | Jang | H10D 30/6729 |
| 2021/0183314 A1 | 6/2021 | Wacyk | |

FOREIGN PATENT DOCUMENTS

| | | |
|---|---|---|
| CN | 102543865 A | 7/2012 |
| CN | 103715196 A | 4/2014 |
| CN | 106783871 A | 5/2017 |

(Continued)

OTHER PUBLICATIONS

Cite the machine translation (JP-6350754-B1.*

(Continued)

Primary Examiner — Phuc T Dang
(74) Attorney, Agent, or Firm — Wolf, Greenfield & Sacks, P.C.

(57) ABSTRACT

Provided is a display panel fabricated with a hybrid semiconductor circuit in a substrate, including a c-Si circuits and a compound semiconductor circuit arranged in separate regions on the substrate. Row scanning circuits of the display panel are fabricated with the c-Si transistors and pixel array of the display panel is fabricated with the compound semiconductor transistors. This arrangement allows low voltage driven CMOS circuit and high voltage driven pixel circuits being integrated together in one substrate.

8 Claims, 5 Drawing Sheets

(56) References Cited

FOREIGN PATENT DOCUMENTS

| CN | 108807375 | A | | 11/2018 | | |
|---|---|---|---|---|---|---|
| CN | 105931988 | B | | 12/2019 | | |
| JP | 6350754 | B1 | * | 7/2018 | ............... | G09F 9/00 |
| KR | 20060078699 | A | * | 7/2006 | | |
| WO | WO-2014155969 | A1 | * | 10/2014 | ............. | G01N 23/04 |

OTHER PUBLICATIONS

Cite the machine translation Wenxu X (KR-20060078699-A).*
Cite the machine translation Yamada Y (WO-2014155969-A1).*
Chinese Search Report dated Nov. 5, 2024, in connection with Chinese Application No. 202111165265.3, with English translation thereof.
Chinese Notice of the first review opinion dated Nov. 11, 2024, in connection with Chinese Application No. 202111165265.3, with English translation thereof.

* cited by examiner

DISPLAY PANEL COMPRISING A SUBSTRATE INCLUDING A FIRST REGION AND A SECOND REGION AND DISPLAY APPARATUS HAVING THE SAME

CROSS-REFERENCE TO RELATED APPLICATION(S)

This application claims priority to Chinse Patent Application No. 202111165265.3 filed Sep. 30, 2021, the disclosure of which is incorporated herein by reference in its entirety.

TECHNICAL FIELD

Embodiments of the present disclosure relate to display technology and, in particular, to a display panel and a display apparatus.

BACKGROUND

With the technology development and market applications of organic light-emitting diode (OLED) displays in augmented reality (AR) and virtual reality (VR) wearable displays, high performance display panels used in OLED micro-displays are increasingly demanded. In particular, an ultra-high resolution in 5000 ppi and therefore an approximately 5-micron pixel pitch have become reality. It is anticipated that the size of a single pixel may eventually approach 1 micron in the near future, and then all transistors inside a pixel circuit must be at a sub-micron level.

Figure 1:
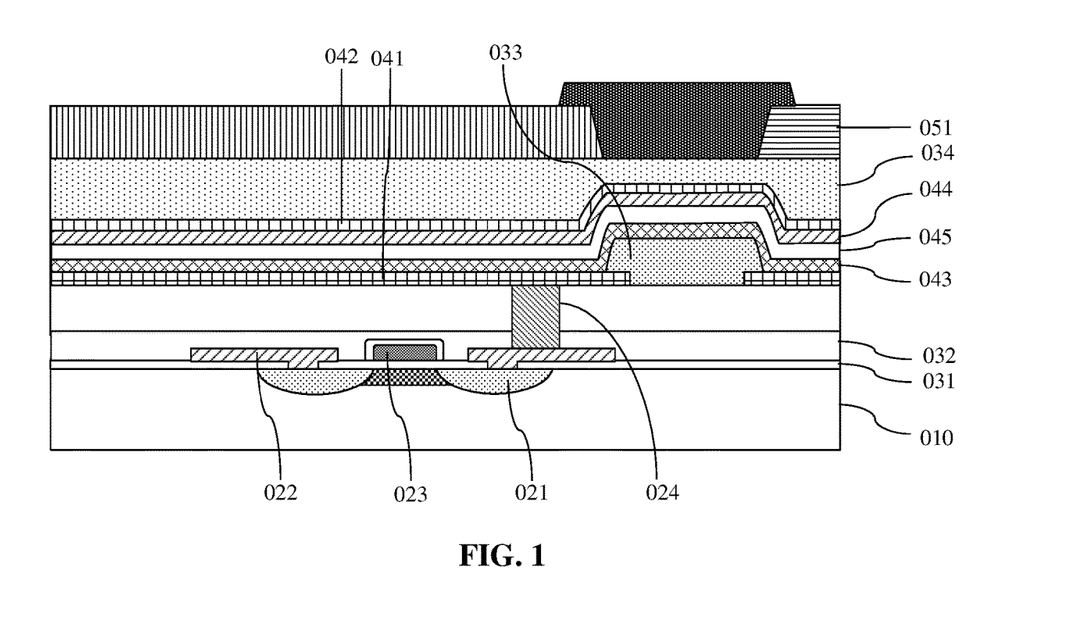
FIG. 1 is a sectional view of a display panel in the related art.

FIG. 1 is a structure diagram of an OLED display fabricated on a silicon wafer, which is also referred to as a silicon-based OLED. Similar to a conventional complementary metal-oxide-semiconductor (CMOS) transistor, heavily doped diffusion regions 021 of a source and a drain are formed in the bulk and on the surface of a silicon substrate 010, and then source and drain metals 022 are formed and are in ohmic contact with the source and drain diffusion regions 021 through vias in an oxide layer 031, respectively. A polysilicon gate 023 is fabricated on the oxide layer 031 to control the on/off state of the transistor. On the same silicon substrate, other components in each pixel, such as a switching transistor for resetting potential, a transistor for compensating for a voltage deviation and a storage capacitor, are fabricated as well. In addition, scan lines, data lines and power lines for controlling the pixels are also fabricated on the silicon substrate through conventional metallization techniques. A pixel array, generally referred to as a backplane of the display panel, is fabricated on the silicon substrate in the manner as described above.

A passivation layer 032 followed by a relatively thick interlayer insulating film are formed on the backplane through an evaporation or coating method. The source of the driving transistor is then connected to an OLED anode metal layer 041 by a connector 024 through a via. Anode metals of the pixels are separated by a pixel defining layer (PDL) 033. The PDL 033 is used to reduce a lateral leakage current or an electrical breakdown between the anode metal and the cathode metal of the OLED caused by a strong fringe field at the edge of the anode metal.

Multiple function layers and a cathode metal layer 042 to form the OLED are sequentially evaporated on the backplane with an array of anode metal pads and a grid of the PDL 033. For simplicity without losing generality, only the simplest three-layer OLED structure is illustrated in FIG. 1, which includes a hole injection and transport layer 043 in contact with the anode metal layer 041, an electron injection and transport layer 044 in contact with the cathode metal layer 042, and an OLED light-emitting layer 045 sandwiched therebetween. A planarization layer 034 is generally formed on the cathode metal layer 042 to reduce surface roughness caused by thickness discrepancy between the anode metals and the PDL 033, so a color filter film can be uniformly coated on an even surface in a subsequent coating process. The color filter films may be in different colors, such as red filters 051, and a black film therebetween. The black film is generally referred to as a black matrix (BM) and used for absorbing large angle light to reduce color cross-talk.

As mentioned above, transistors at the sub-micron level may be necessary to realize an ultra-high resolution display panel. In such a case, as the size of the transistor on the substrate is reduced, the geometric dimension of the transistor in a depth direction should be reduced as well according to scaling down rule in an IC manufacture foundry. For example, an ion implantation depth and an ion diffusion depth of a doped region and a thickness of a gate dielectric film should be reduced accordingly. Not only the geometric dimension of the transistor but also its driving voltage should be scaled down accordingly. On the other hand, a sufficiently high voltage is necessary for driving an OLED film, so as to generate a sufficient current density in an organic film with a quite low carrier mobility and therefore to excite more photons. For example, a 5V voltage is normally needed on the OLED film to realize sufficient brightness and image grayscales. To further boost light output, some OLED panels have adopted a structure where two OLEDs are stacked up. As a consequence, a bias voltage to appropriately drive the two series-connected OLEDs is doubled to 10V.

However, such a high voltage inevitably induces various problems in a sub-micron CMOS circuit. In particular, the various problems include a lateral leakage current between the source and the drain of the transistor in a threshold or subthreshold region, a vertical leakage current between the source/drain diffusion regions 021 and the silicon substrate, a gate leakage current through the oxide layer 031, drain-induced barrier lowering (DIBL) of the transistor due to a drain voltage, and various parasitic effects originated from the leakage current and electric field stress in the silicon substrate. Among these parasitic effects, a latch-up effect most frequently occurs and is harmful to the CMOS IC. The latch-up effect means that a path of a parasitic leakage current with low impedance is developed between a power supply and a ground potential of the silicon substrate due to coupling of parasitic PNP and NPN bipolar junction transistors (BJTs). The higher density the CMOS IC has, the higher risk the latch-up effect occurs at. A large leakage current not only increases power consumption but may also burn an IC chip in an extreme case.

To solve the related problems of the silicon-based OLED with a high resolution, eMagin (US20210183314A1) provides a structure and a method in which transistors driven at a high voltage and transistors driven at a low voltage are fabricated on two different substrates, separately. The two different substrates are then stacked up by connecting related electrode arrays using conductive connection, where the transistors in the two different substrates are fabricated with different technologies and with different scaling down rules. However, this method has a tremendous challenge in perfectly aligning and connecting tens of millions of tiny electrode pads on the two substrates. Such an attempt may easily fail for wafer expansion/contraction due to different thermal cycles and separate photolithography processes.

Considering that all the preceding effects occur in the bulk silicon substrate, another method is to replace the transistor easily affected by the leakage currents with a thin-film transistor (TFT) so as to avoid the leakage currents between the diffusion regions and the silicon substrate and other parasitic effects. In particular, a metal oxide semiconductor TFT, such as an indium gallium zinc oxide (IGZO) TFT, has a source-to-drain leakage current which is much smaller than the leakage current of a polysilicon or amorphous silicon TFT. Reference is made to CN103715196A and CN105931988B, where in the driving backplane of the display with a large area, a polysilicon TFT with a high mobility is used as a transistor for driving the OLED and a metal oxide semiconductor TFT is used as a switching transistor for controlling data writing. However, the polysilicon TFT is neither suitable for a highly integrated CMOS circuit for data signal input and processing nor suitable for driving the OLED. On the one hand, due to defect states at polysilicon grain interfaces and on gate insulator interface, non-uniformity of the characteristic of the polysilicon TFT become significant as the transistor dimensions are approaching the sizes of the polysilicon grains. On the other hand, the TFT has drawbacks originated from a self-heating effect and a floating body effect. The semiconductor channel transferring electric current in the TFT is confined between upper and lower insulating films and therefore its thermal conductivity is approximately 1% of that of the bulk silicon transistor. In other words, heat generated by a channel current has difficulty to dissipate. In case the TFT is driven at a relatively high frequency and a relatively high current density, a rapid temperature rise may lead to performance degradation such as reduction of carrier mobility and accelerated aging of the OLED material. For example, in a 2K×2K display panel, an operating frequency of a transistor in a driving module or a signal processing circuitry is at least two thousand times higher than an operating frequency of a transistor in a pixel array. In addition, the floating body effect may double the ESD susceptibility of the TFT, resulting in a higher ESD risk in the entire display backplane.

Moreover, an OLED pixel array and its peripheral driving and signal processing circuitries are integrated on one silicon-based OLED display panel. To achieve a narrow border or even a border-less display and low power consumption, a large number of transistors in tens of nanometers may be integrated along the narrow border. Conflicts in driving voltage between the peripheral circuitry and the OLED pixel array will become more severe.

SUMMARY

Provided is a display panel which includes a single-crystal silicon (c-Si) substrate including a first region and a second region. The first region includes a c-Si transistor circuit fabricated in the c-Si substrate, and the c-Si transistor circuit includes a signal processing circuit and a control circuit of the display panel. The second region includes an array of pixel circuits of the display panel and a light-emitting layer superimposed above the array of pixel circuits. The array of pixel circuits is fabricated in the c-Si substrate and includes a plurality of compound semiconductor thin-film transistors (TFTs). The light-emitting layer which is controlled by the array of pixel circuits comprises at least one of the followings: an OLED film, an inorganic LED chip, a nano-sized light-emitting particle or an inorganic electroluminescent film. The first region or the second region further comprises row scanning circuits located on one side or two sides of the array of pixel circuits.

The display panel can implement two different circuits, i.e., the signal processing circuit and the control circuit of c-Si transistors and the array of pixel circuits of compound semiconductor TFTs. The hybrid semiconductor circuit ensures that a relatively high voltage for driving a light-emitting layer in a display region will not cause parasitic effects such as a latch-up effect in the c-Si substrate, while allows the integrated circuit in the c-Si substrate being driven by a relatively low voltage and maintaining its advantages of high speed and low power consumption.

Another embodiment of the present disclosure further provides a display apparatus including the preceding display panel.

DETAILED DESCRIPTION

The present disclosure is further described hereinafter in detail in conjunction with drawings and embodiments. It is to be understood that the embodiments are intended to illustrate and not to limit the present disclosure. Additionally, for ease of description, the structures shown in the drawings may be part or all.

Terms, such as "on", "under", "in", "left" and "right" in the embodiments, are described from the point of view in the drawings and are not to be construed as limiting the embodiments. Additionally, in the context, it is to be understood that when an element is formed "on" another element, the element can not only be directly formed "on" the other element but also be indirectly formed "on" the other element through an intermediate element. Terms, such as "first" and "second", are used only for the purpose of description to distinguish between different components and not to indicate any order, quantity or importance. For those of ordinary skill in the art, specific meanings of the preceding terms in the present disclosure may be understood based on specific situations.

Figure 2:
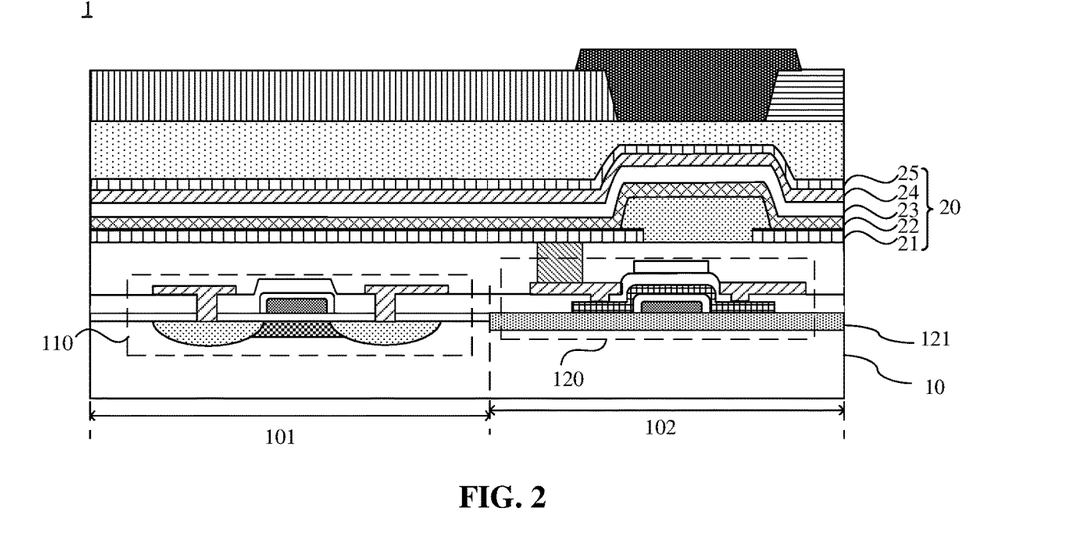
FIG. 2 is a sectional view of a display panel according to an embodiment of the present disclosure.

Embodiments of the present disclosure provide display panels applicable to AR or VR wearable display devices. FIG. 2 is a sectional view of a display panel according to an embodiment of the present disclosure. Referring to FIG. 2, a display panel 1 includes a c-Si substrate 10 which further includes a first region 101 and a second region 102. The first region 101 includes a plurality of c-Si transistors 110 fabricated on the c-Si substrate 10 for a signal processing circuit and a control circuit of the display panel 1. The second region 102 includes a plurality of compound semiconductor TFTs 120 for an array of pixel circuits of the display panel 1. The c-Si substrate 10 is overlaid with a light-emitting layer 20 wherein its light-emitting status is controlled by the array of pixel circuits. Each pixel circuit provides a relatively high voltage to the light-emitting layer 20 for an adequate brightness but avoids triggering various parasitic effects in the first region.

In the first region 101, the c-Si transistors 110 are fabricated directly in the bulk and on the surface of the c-Si substrate 10. The specific structures of these c-Si transistors 110 are similar as those shown in FIG. 1 and therefore not described in detail hereinafter. In the second region 102, a high-quality silicon oxide layer 121 is formed on the surface of the c-Si substrate 10 and then the compound semiconductor TFTs 120 are made on the silicon oxide layer 121. The high-quality silicon oxide layer 121 may be formed by at least one of the following processes: performing high temperature oxidation on the surface of the c-Si substrate 10; depositing silicon oxide on the surface of the c-Si substrate 10 through chemical vapor deposition; or performing low energy ion implantation of oxygen atoms followed by a high temperature annealing.

As shown in FIG. 2, the light-emitting layer 20 may include at least one of the followings: an OLED in the form of thin film, an inorganic LED chip, a nano-sized light-emitting particle or an inorganic electroluminescent film. Taking an OLED as an example, an OLED layer 20 includes an OLED anode metal 21, an OLED hole injection layer 22, an OLED light-emitting layer 23, an OLED electron injection layer 24 and an OLED cathode metal 25. Provided electrons and holes are injected into the OLED light-emitting layer 23 respectively through the OLED electron injection layer 24 and the OLED hole injection layer 22, and the OLED light-emitting layer 23 emits light through recombination of the electrons and holes. The compound semiconductor TFTs 120 fabricated for the array of pixel circuits can provide the relatively high voltage for driving the OLED light-emitting layer 23, to ensure adequate light output from the OLED and high performance of the display panel 1.

Based on the above embodiment, the display panel 1 is provided with a hybrid semiconductor circuit which includes a c-Si circuit (i.e., CMOS IC) and a compound semiconductor circuit arranged in separate regions on the substrate. Thus, the display panel 1 of the embodiment can ensure the relatively high voltage for driving the light-emitting layer 20 without causing various parasitic effects such as an excessive lateral leakage current and high electric field stress in the bulk of the c-Si substrate.

The c-Si transistors 110 in the first region 101 and the compound semiconductor TFTs 120 in the second region 102 are operated at a low voltage and a high voltage, respectively, thereby satisfying the different requirements for driving the CMOS IC and the light-emitting layer. That is to say, on one hand, the highly integrated CMOS circuit, which is built in the c-Si substrate in the first region, is driven by a relatively low voltage and has the advantages of a high speed, low power consumption and less heat generation; and on the other hand, the array of pixel circuits, which includes the compound semiconductor TFTs in the second region, is capable of providing a relatively high voltage for the OLED to obtain a large dynamic range and adequate brightness, thereby avoiding high voltage related problems such as a latch-up effect and leakage currents in the bulk silicon transistor.

Figure 3:
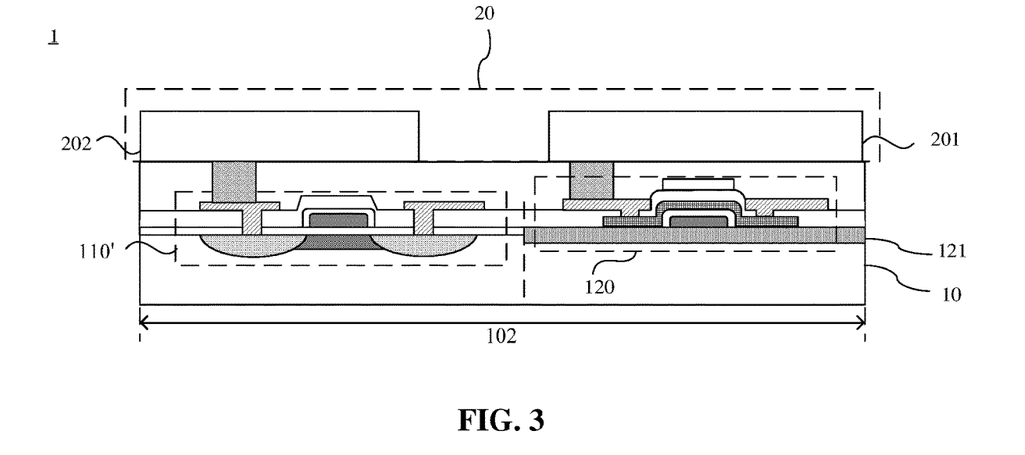
FIG. 3 is a sectional view of another display panel according to an embodiment of the present disclosure.

In another embodiment, as shown in FIG. 3, a hybrid pixel array is utilized, which includes the compound semiconductor TFTs 120 and c-Si transistors 110' as driving device, a hybrid light-emitting layer comprising an OLED film 201 and an inorganic LED microchip 202 in the second region 102, wherein the inorganic LED microchip 202 is driven by the c-Si transistor 110', and the OLED film 201 is driven by the compound semiconductor TFT 120. The OLED film 201 and the inorganic LED microchip 202 can be driven by voltages in different amplitude, respectively, thereby the performances of the two types of light-emitting layers such as chromaticity and lifetime can be optimized separately. Since organic and inorganic LEDs may have different threshold voltages for light emission and different current-voltage curves, the hybrid light-emitting layer can bring in an additional flexibility for display operation and a better performance, for example, an enhanced dynamic range of brightness of the display panel. Alternatively, the organic and inorganic LEDs may be connected in series and driven by the same pixel circuit.

The inorganic LED microchip, or micro-LED, may be a GaN LED relocated from an epitaxial wafer to the c-Si substrate through a massive transferring process. Each micro-LED has an anode terminal and a cathode terminal, that one of these two terminals is electrically connected to a source of the respective c-Si transistor 110'.

In an embodiment, different color filters are further superimposed on the hybrid light-emitting layer as needed. Alternatively, color filters may not be used, provided that the organic or the inorganic LEDs emitting light in their own colors, which can greatly improve luminescence efficiency.

Figure 4:
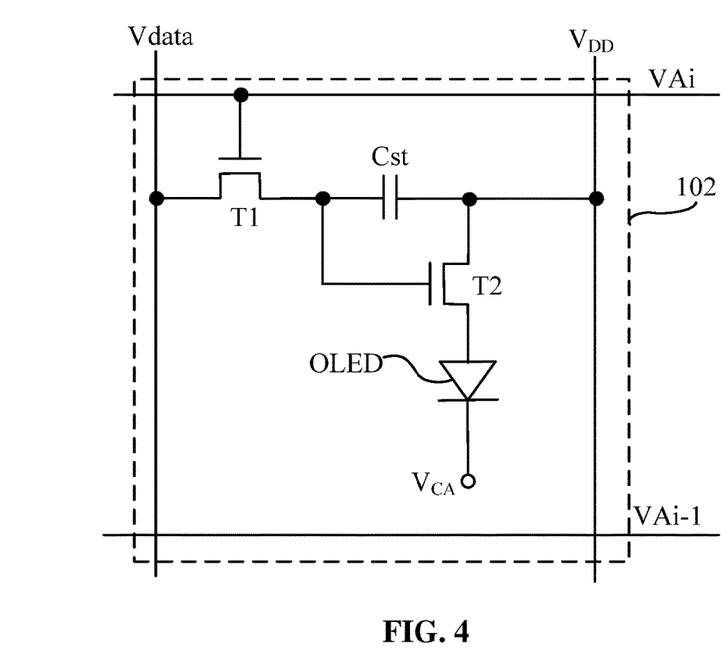
FIG. 4 is a schematic diagram of an equivalent pixel circuit according to an embodiment of the present disclosure.

In the following embodiments, an OLED display panel is used as an example. FIG. 4 is a schematic diagram of an equivalent OLED pixel circuit according to an embodiment of the present disclosure. As shown in FIG. 4, only one pixel circuit of the pixel circuits is illustrated, where the pixel circuits are arranged orthogonally in rows and columns (not shown in the figure) in a display region of the display panel. Each pixel circuit includes at least a storage capacitor Cst, a switching transistor T1 for controlling the input of a signal voltage to the storage capacitor Cst, and a driving TFT T2 for driving the OLED. In FIG. 4, the elements of each pixel circuit are all located in the second region 102.

Figure 5:
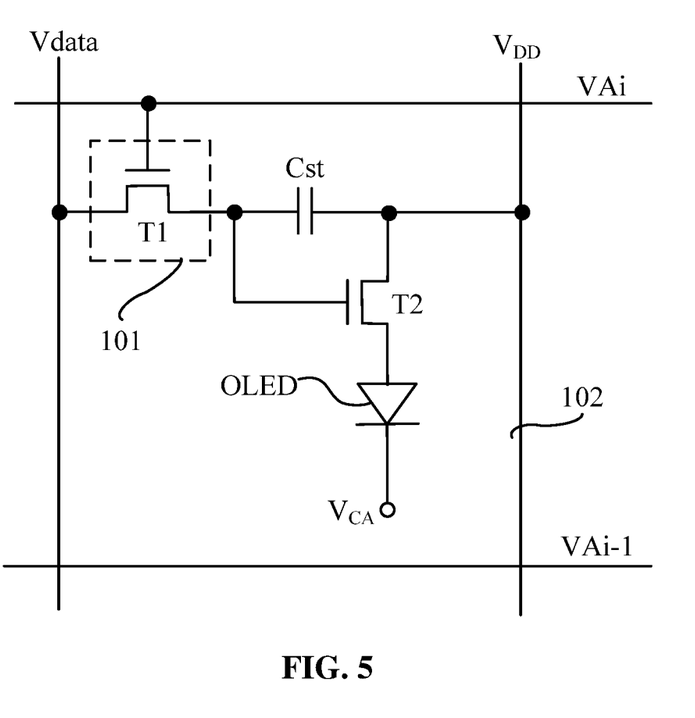
FIG. 5 is a schematic diagram of another equivalent pixel circuit according to an embodiment of the present disclosure.

In another embodiment, as shown in FIG. 5, each pixel circuit includes a c-Si transistor T1' as the switching transistor. Since a relatively low driving voltage is provided for T1', T1' can be located in the first region 101. Also shown in FIG. 5, the driving TFT T2 is located in the second region 102 since a relatively high voltage of, for example, 5 V or 7.5 V is provided to the T2. The storage capacitor Cst may be located in the second region 102 as shown in FIGS. 4 and 5 or may be located in the first region 101 with the T1'. In other embodiments, the pixel circuit may be a 7T1C circuit or any other circuits in which transistors may include the TFT(s) and the c-Si transistor(s).

In an embodiment, as shown in FIGS. 4 and 5, scan lines VAi, power lines $V_{DD}$, and data lines Vdata are all made in the second region 102 to reduce the parasitic capacitance with the silicon substrate.

In conjunction with FIG. 2 and FIG. 5, the OLED anode metal 21 is fabricated above the first region 101 and the second region 102, and the OLED cathode metal 25 is connected to an external constant voltage power supply $V_{CA}$. The $V_{CA}$ may vary between 0V and −10V according to an OLED material and a structure used. A voltage drop from the $V_{CA}$ to a source of the driving TFT T2 equals a bias voltage across the OLED 20. When the OLED 20 is enabled not to emit light, a signal voltage less than a threshold voltage of the driving TFT T2 is written into a gate of the T2 so that the T2 is in an off state; and at this time, a source potential of the T2 is close to a potential of the OLED cathode metal 25, while a drain of the T2 always has a potential of about +5V from $V_{DD}$. Therefore, the T2, which is fabricated on an insulating film (e.g., silicon oxide layer) in the second region 102, can withstand a voltage drop far exceeding a voltage drop that the c-Si transistor at a deep submicron level can withstand.

In contrast to display panels applicable to AR or VR wearable display devices in the present disclosure, a c-Si wafer cannot be used as the substrate for a large-area OLED display screen according to current manufacturing process technology and cost considerations. For the large-area OLED display screen, a switching transistor and a driving transistor for the OLED must be fabricated on an insulator such as glass and the switching transistor and the driving transistor should be TFTs. Considering that a relatively large current can be withstood between a source and a drain of a polysilicon TFT, the large-area OLED display screen uses a metal-oxide TFT as the switching transistor and a polysilicon TFT with the higher mobility as the driving transistor in the related art. However, in the embodiments of the present disclosure, since the c-Si transistors can be used as the switching transistor and other transistors that do not directly drive the OLED, the c-Si wafer can be used. The c-Si transistor is built in a perfect c-Si crystal with a high-quality gate oxide formed in an extremely high temperature, so a defect density in the transistor is very low, and a leakage current of the c-Si transistor is much smaller than that of a low temperature polysilicon TFT (LTPS-TFT).

Figure 6:
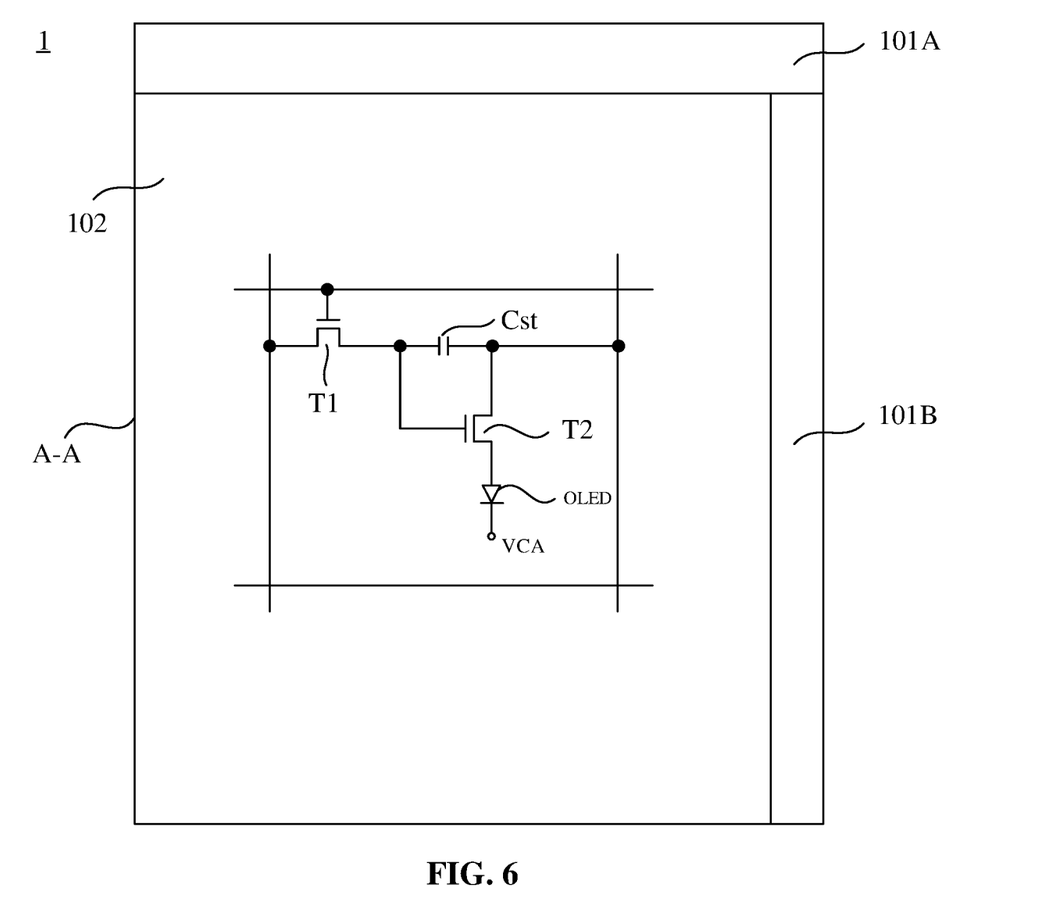
FIG. 6 is a block diagram of an OLED display panel according to an embodiment of the present disclosure.

In an embodiment, the first region 101 and the second region 102 can be divided not only at pixel circuit level, but also on the whole silicon-based display panel. FIG. 6 is a block diagram of an OLED display panel according to an embodiment of the present disclosure. As shown in FIG. 6, the display panel includes a second region 102 dedicated for the array of pixel circuits (only one pixel circuit is shown as an example in the figure), a first region 101 comprising 101A and 101B, dedicated for the signal processing and control circuits, and for the scanning circuits, respectively. Transistors, capacitors, metal wires and the like for all pixels in the second region 102 are fabricated on the silicon oxide layer 121 (as shown in FIG. 2). With this arrangement, a highly integrated c-Si CMOS circuit can be implemented in the region 101A and the region 101B, and a small leakage current, low parasitic capacitance and low power consumption of the TFT can be realized in the second region 102.

As mentioned above, the TFTs are susceptible to various ESD events such as machine model or human body model. In particular, when a large-sized TFT array is fabricated on an insulating substrate such as a glass plate, TFTs and various metal wires are in a substantially electrically floating state and hence very susceptible to ESD damages before driving ICs are connected to the TFT array. However, in the embodiments of the present disclosure, all the metal wires, including scan lines, data lines and power lines, are connected to the integrated CMOS circuit in the region 101A and the region 101B during the manufacturing of the metal wires so that various ESD protections built into the c-Si CMOS IC can effectively kick-in to prevent ESD damages during the manufacturing.

Alternatively, the region 101B may be part of the second region 102, and then shift registers for the scanning circuits that generate row scanning control pulses may also be fabricated using the TFTs. Thus, the scanning circuits can deal with the generation and output of a relatively high scanning voltage.

In an embodiment, the scanning circuits may be located on one side or two sides of the display region A-A. The scanning circuits supply row scanning control pulses VAi to the row scan lines to sequentially turn on or turn off the pixel switches in each scan row. As shown in FIG. 6, the scanning circuits are located on the right side of the array of pixel circuits for progressive scanning. Alternatively, the scanning circuits can be located on both left and right sides for interdigital scanning, and both the left and right sides can be part of the first region 101 or the second region 102.

Now referring back to FIG. 2, both the single-crystal silicon transistor 110 fabricated in the first region 101 and the TFT 120 fabricated in the second region 102 have polysilicon gates, which may be manufactured simultaneously or separately. Alternatively, the gates of these transistors 110 and 120 may be made of different conductive materials such as an alloy of metal (i.e., copper), and the like. Polysilicon is preferred for the gate material because the polysilicon gate can be conformally passivated through oxidation of a polysilicon film, while additional film evaporation is required for metal gates. Alternatively, source/drain metals of these transistors 110 and 120 may be manufactured simultaneously by being deposited in a plasma sputtering manner, or ion implantation and diffusion may also be performed simultaneously, thereby simplifying the manufacturing processes of the hybrid semiconductor substrate.

Figure 7:
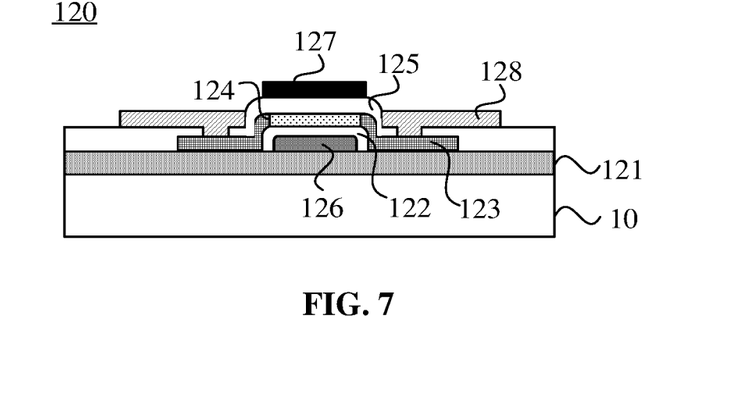
FIG. 7 is a sectional view of a thin-film transistor according to an embodiment of the present disclosure.

FIG. 7 is a structure diagram of a TFT according to an embodiment of the present disclosure. As shown in FIG. 7, a compound semiconductor layer of the TFT 120 includes one of the following materials: a metal oxide semiconductor material, a group II-IV compound semiconductor material or a group III-V compound semiconductor material. The metal oxide semiconductor material includes ZnO, CdO, MgO or IGZO. The group II-IV compound semiconductor material includes ZnSe, ZnS, ZnTe, CdSe, CdTe or CdS. The group III-V compound semiconductor material includes GaAs, GaP, InAs or InP. In an embodiment, the semiconductor layer of the TFT 120 may be made with multiple materials including the metal oxide semiconductor material, the group II-IV compound semiconductor material and the group III-V compound semiconductor material.

Taking the metal oxide semiconductor material as an example, as shown in FIG. 7, the display panel 1 includes a double-gate metal-oxide-semiconductor TFT 120. The double-gate metal-oxide-semiconductor TFT 120 includes a silicon oxide layer 121, a bottom gate 126, a top gate 127, a bottom gate dielectric layer 122, a top gate dielectric layer 125, a TFT doping region 123, a channel region 124, and a source/drain metal 128.

Figure 8:
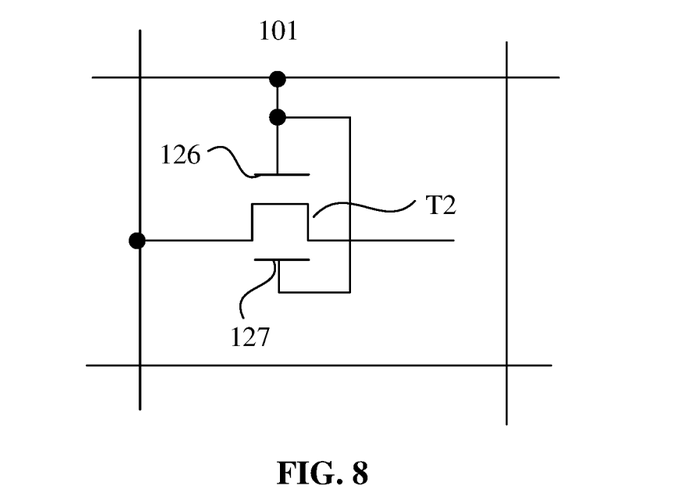
FIG. 8 is a schematic diagram of an equivalent circuit of a double-gate oxide semiconductor TFT according to an embodiment of the present disclosure.

FIG. 8 is a schematic diagram of an equivalent circuit of the double-gate metal-oxide-semiconductor TFT according to an embodiment of the present disclosure. As shown in FIGS. 7 and 8, the bottom gate 126 serves as a main control gate for driving the double-gate metal-oxide-semiconductor TFT 120, and the top gate 127 may be connected to the bottom gate 126 in the pixel through a via. Alternatively, the top gate 127 can be set at an electrically floating state. For simplicity, single-gate TFTs may be used in the equivalent pixel circuits of the present disclosure, as illustrated in FIGS. 4 to 6. However, it is to be understood that the compound semiconductor TFT in the second region 102 may be the double-gate TFT as shown in FIGS. 7 and 8 or the double-gate TFT with an electrically floating top gate.

In an embodiment, the TFT doping region 123 is a metal oxide film deficient in oxygen atoms which is made by a hydrogen plasma treatment on the metal oxide semiconductor in a self-alignment manner using the top gate 127 as a mask. The formed TFT doping region 123 has a relatively high electrical conductivity so that the TFT doping region 123 can be in good ohmic contact with the source/drain metal 128 and can also provide a current to or receive a current from the channel region 124.

In an embodiment, the top gate 127 is made of an opaque metal material, so it can be utilized as a mask as mentioned above, and as light shielding during display operation, aiming for reduction of a photo-induced leakage current. The top gate 127 can also serves as a blocking layer to prevent moisture, hydrogen ions and the like from entering the semiconductor layer and causing performance degradation.

In an embodiment, the bottom gate 126 of the double-gate TFT 120 is made of polysilicon and may be deposited on the substrate at the same time as the polysilicon gate of the c-Si transistor 110. The bottom gate 126 can be a main control gate for driving the double-gate TFT 120.

In an embodiment, the bottom gate dielectric layer 122 is formed by high temperature oxidation or nitridation on patterned polysilicon and is preferable for its relatively low defect density. The top gate dielectric layer 125 is evaporated by a magnetron sputtering method or other methods at room temperature or at a relatively low temperature (such as temperature less than 350° C.) to keep the metal oxide film stable, which is susceptible to high temperature recrystallization. Therefore, both the density and defect density of the top gate dielectric layer 125 are inferior to those of the bottom gate dielectric layer 122. To ensure a relatively low gate leakage current, a thickness of the top gate dielectric layer 125 is greater than a thickness of the bottom gate dielectric layer 122. For example, the top gate dielectric layer 125 has a thickness of greater than 500 nm.

In an embodiment, a thickness of the silicon oxide layer 121 is at least 50 nm. The relatively thick silicon oxide layer 121 can significantly reduce parasitic capacitance and a leakage current between the bottom gate 126 and the c-Si substrate 10.

In an embodiment, the channel region 124 of the TFT 120 has a channel length of less than 0.5 microns. In addition, the semiconductor in the channel region 124 is lightly doped for threshold voltage adjustment. A reduction in the threshold voltage and therefore a reduction of the gate voltage will lead to lower power consumption.

As a size of each pixel decreases to several microns or even approximately one micron, the geometric dimension of the TFT in each pixel may be at a deep sub-micron level. For example, considering a 1 μm×1 μm pixel built in the second region, half an area of the pixel is used for fabricating a pixel circuit including the TFT with a 0.4 μm channel length and a 0.8 μm channel width, where a width-to-length ratio is W/L=2. Assuming that the electron mobility of the TFT is only 10 $cm^2/cm \cdot s$, and a 50 nm gate dielectric film, a 3 V gate-to-source voltage, a 0.5 V threshold voltage and a 1 V source voltage are provided, a saturation current of the TFT can reach 240 nA. For an OLED with a 1000 $mA/cm^2$ current density, the current of the OLED inside the 1 μm×1 μm pixel is merely 10 nA, which is far less than the saturation current of the metal oxide TFT.

It should be noted that, for a pixel which has an area of greater than 10 μm×10 μm, a TFT with a high mobility and a great width-to-length ratio is preferable in order to provide a sufficient current to the OLED, and that is main reason that a LTPS (low-temperature polysilicon) TFT with a high mobility is used for driving the OLED display in a mobile phone with a screen size much bigger than the AR or VR wearable device. However, for a pixel smaller than 10 μm×10 μm, suggested in the above analysis, the metal-oxide-semiconductor TFT is a preferable choice for driving the OLED display panel with a high resolution, high brightness and low leakage current, these features are particularly important for the AR or VR wearable devices.

The metal-oxide-semiconductor is normally a unipolar conductive material, for example, TFTs made of IGZO have electron mobility up to 100 $cm^2/v \cdot s$., while its hole mobility is negligible. Therefore, building a CMOS circuit and utilizing its high speed and low power features with metal-oxide-semiconductor is simply not feasible. In this case, a hybrid circuit combining the c-Si transistors and the metal-oxide-semiconductor TFTs is indeed preferable for the AR or VR wearable device. In addition, from the perspective of integration and encapsulation processes of a display, the general method of bonding a driving IC to a glass substrate for the display screen of the mobile phone has reached a limit of a narrowed border, so there is a good manner of achieving an extremely narrowed border according to the embodiments of the present disclosure in which driving modules are fabricated on the periphery of the c-Si substrate and the array of pixel circuits in the display region is directly superimposed on the c-Si substrate.

An embodiment of the present disclosure further provides a display apparatus including a display panel provided in the preceding embodiments. The display apparatus may be an AR or VR wearable device.

The preceding descriptions are only exemplary embodiments of the present disclosure, which is therefore not limited to the exemplary embodiments. Those skilled in the art can make various apparent modifications, adaptations, combinations and substitutions without departing from the scope of the present disclosure, which is determined by the following claims.

What is claimed is:

1. A display panel, comprising a single-crystal silicon (c-Si) substrate which comprises a first region and a second region;
    wherein the first region comprises a c-Si transistor circuit fabricated in the c-Si substrate, and the c-Si transistor circuit comprises a signal processing circuit and a control circuit of the display panel;
    wherein the second region comprises an array of pixel circuits of the display panel and a light-emitting layer superimposed above the array of pixel circuits, the array of pixel circuits is fabricated in the c-Si substrate and comprises a plurality of compound semiconductor thin-film transistors, and the light-emitting layer which is controlled by the array of pixel circuits comprises at least one of the followings: an OLED film, an inorganic LED chip, a nano-sized light-emitting particle or an inorganic electroluminescent film;
    wherein the first region or the second region further comprises row scanning circuits located on one side or two sides of the array of pixel circuits;
    wherein the array of pixel circuits further comprises a plurality of c-Si transistors, and the light-emitting layer comprises a hybrid light-emitting layer including the OLED film and the inorganic LED chip; and
    wherein the OLED film is driven by the plurality of compound semiconductor thin-film transistors, and the inorganic LED chip is driven by the plurality of c-Si transistors in the array of pixel circuits.

2. The display panel of claim 1, wherein the row scanning circuits which are located in the second region comprise a plurality of thin-film transistors.

3. The display panel of claim 1, wherein a semiconductor material used in each of the compound semiconductor thin-film transistors comprises one of the following materials:
- a metal oxide semiconductor material comprising ZnO, CdO, MgO or indium gallium zinc oxide (IGZO);
- a group II-IV compound semiconductor material comprising ZnSe, ZnS, ZnTe, CdSe, CdTe or CdS; or
- a group III-V compound semiconductor material comprising GaAs, GaP, InAs or InP.

4. The display panel of claim 1, wherein a polysilicon gate of each of the c-Si transistors and a polysilicon gate of each of the compound semiconductor thin-film transistors are manufactured simultaneously.

5. The display panel of claim 1, wherein each of the compound semiconductor thin-film transistors is a double-gate thin-film transistor comprising a bottom gate and a top gate; and
wherein the top gate is connected to the bottom gate or is in an electrically floating state.

6. The display panel of claim 5, wherein a top gate dielectric layer has a greater thickness than a bottom gate dielectric layer.

7. The display panel of claim 1, wherein each of the compound semiconductor thin-film transistors has a channel length of less than 0.5 microns.

8. A display apparatus, comprising a display panel, wherein the display panel comprises a single-crystal silicon (c-Si) substrate which comprises a first region and a second region;
wherein the first region comprises a c-Si transistor circuit fabricated in the c-Si substrate, and the c-Si transistor circuit comprises a signal processing circuit and a control circuit of the display panel;
wherein the second region comprises an array of pixel circuits of the display panel and a light-emitting layer superimposed above the array of pixel circuits, the array of pixel circuits is fabricated in the c-Si substrate and comprises a plurality of compound semiconductor thin-film transistors, and the light-emitting layer which is controlled by the array of pixel circuits comprises at least one of the followings: an OLED film, an inorganic LED chip, a nano-sized light-emitting particle or an inorganic electroluminescent film;
wherein the first region or the second region further comprises row scanning circuits located on one side or two sides of the array of pixel circuits;
wherein the array of pixel circuits further comprises a plurality of c-Si transistors, and the light-emitting layer comprises a hybrid light-emitting layer including the OLED film and the inorganic LED chip; and
wherein the OLED film is driven by the plurality of compound semiconductor thin-film transistors, and the inorganic LED chip is driven by the plurality of c-Si transistors in the array of pixel circuits.

* * * * *